United States Patent
Campbell et al.

(10) Patent No.: US 6,650,131 B2
(45) Date of Patent: Nov. 18, 2003

(54) ELECTRICAL TEST PROBE WEDGE TIP

(75) Inventors: Julie A. Campbell, Beaverton, OR (US); Christina Colby Barsotti, Vancouver, WA (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/364,023

(22) Filed: Feb. 10, 2003

(65) Prior Publication Data

US 2003/0189438 A1 Oct. 9, 2003

Related U.S. Application Data

(63) Continuation of application No. 09/629,017, filed on Jul. 31, 2000, now Pat. No. 6,518,780.

(51) Int. Cl.[7] ................................................ G01R 31/02
(52) U.S. Cl. ..................................... 324/754; 324/72.5
(58) Field of Search ............................... 324/754, 72.5, 324/761, 133, 149, 752; 439/482, 842

(56) References Cited

U.S. PATENT DOCUMENTS

| | | |
|---|---|---|
| 3,992,073 A | 11/1976 | Buchoff et al. |
| 4,251,772 A | 2/1981 | Worsham et al. |
| 4,548,207 A | 10/1985 | Reimels |
| 4,665,927 A | 5/1987 | Daily |
| 4,680,542 A | 7/1987 | Krupp |
| 4,943,768 A | 7/1990 | Niki et al. |
| 4,987,364 A | 1/1991 | Watts |
| 5,387,872 A | 2/1995 | Nightingale |
| 5,391,082 A | 2/1995 | Airhart |
| 5,397,994 A | 3/1995 | Phare |
| 5,463,324 A | 10/1995 | Wardwell et al. |
| 5,507,652 A | 4/1996 | Wardwell |
| 5,701,086 A | 12/1997 | Wardwell |
| 5,923,177 A | 7/1999 | Wardwell |
| 5,982,187 A | 11/1999 | Tarzwell |
| 6,016,061 A | 1/2000 | Mizuta |
| 6,271,672 B1 | 8/2001 | Swart et al. |
| 6,271,673 B1 | 8/2001 | Furuta et al. |

*Primary Examiner*—Kamand Cuneo
*Assistant Examiner*—Paresh Patel
(74) *Attorney, Agent, or Firm*—Karen Dana Oster

(57) ABSTRACT

An electrical test probe tip of the present invention has a longitudinal axis extending from a first end to a second end and an electrically conductive interior extending substantially therebetween. A conductive exterior-most surface at least partially surrounds the electrically conductive interior. The test probe tip has a maximum length measured from the first end to the second end and has a minimum length measured from the first end to the second end. An electrically insulated surface at the first end substantially descends from the maximum length to the minimum length. The electrical test probe tip may be inserted between a target IC pin and the electrically insulated surface faces the adjacent IC pin.

9 Claims, 3 Drawing Sheets

ELECTRICAL TEST PROBE WEDGE TIP

The present application is a continuation of U.S. patent application Ser. No. 09/629,017, filed Jul. 31, 2000, now U.S. Pat. No. 6,518,780. The present application is based on and claims priority from this, the disclosure of which is hereby incorporated herein by reference.

BACKGROUND OF INVENTION

The present invention relates to an electrical test probe tip for use with testing instruments, and more particularly a wedge-shaped electrical test probe tip.

Integrated circuit devices (hereinafter referred to as "ICs") come in a wide variety of shapes and sizes depending on the function of the particular device. ICs have a set of pins, leads, or legs (hereinafter referred to as "pins") that function as a conductive path between the internal circuitry of the IC and the external circuit to which the IC is interfaced. ICs have evolved from devices with relatively large and widely spaced pins to devices with small, closely spaced pins. Pins on modern ICs may be spaced less than a millimeter apart.

To measure an electrical signal of an IC, a test probe is connected to an oscilloscope, digital multimeter, or other measuring, monitoring, diagnostic, or signal processing instrument (herein referred to as a "testing instrument"). At one end of a test probe is a probe tip. The probe tip may be integral or replaceable. Typically, the probe tip is an elongate conductive member that terminates in a conical, blunt, or rounded point. FIG. 1 shows one example of a traditional probe tip.

When a probe tip contacts a pin, it forms an electrical connection therewith. The electrical signal on the pin may then be measured. It is difficult to form a contact with a single pin on a modern IC using a traditional probe tip because of the small geometry and close spacing of the pins. If the probe tip contacts two adjacent pins simultaneously, a short circuit between the two adjacent pins results. A short circuit prevents measurement of the desired signal, and in some situations, may result in damage to the internal circuitry of the IC. A traditional probe tip provides no means of preventing the occurrence of a short circuit.

U.S. Pat. No. 4,943,768 to Niki, et al. sets forth a description of a testing device (hereinafter referred to as the "Niki device") for electrical circuit boards. The Niki device is designed to make simultaneous electrical connections with multiple horizontal test terminals on a circuit board and is, therefore, relatively wide. Strips of conductive material appear on the surface of the body and are arranged in conformity with the parallel test terminals on the circuit board. The Niki device has a tapered, sharp edge at its lower end that is suitable only for measurement of signals appearing on the multiple horizontal test terminals. The Niki device is unsuitable for insertion between the pins of an IC because its relatively wide body would likely contact other components on a circuit board. If the Niki device were to be inserted between adjacent pins of an IC, the result would depend on the particular arrangement of the strips of conductive material on the surface of the body. One possibility is that a strip would contact both adjacent pins causing a short circuit. A second possibility is that only the probe body would contact the pins resulting in an open circuit between the conductive strip and the testing instrument. For this reason, proper measurement of the desired signal is unlikely.

U.S. Pat. No. 4,987,364 to Watts sets forth a description of a device (hereinafter referred to as the "Watts device") for use in testing printed circuit boards. The Watts device is designed to measure signals from two types of test pads on the surface of a circuit board. The first type of test pad has a small geometry, while the second type has a large geometry with a hole in its center. The Watts device consists of a probe body that is generally thin and sheet-like (described in the specification as "laminar"). The preferred embodiment of the Watts device has a probe body that includes a bottom edge that tapers downward in a stair-step fashion to provide a contact portion. The Watts device relies on the thin geometry of its probe body to avoid simultaneous contact with more than a single test pad. For its stated purpose, insulated surfaces on the body perpendicular to the plane of the circuit are unnecessary. Without insulated surfaces, however, insertion of the Watts device between adjacent pins of an IC would likely result in a short circuit.

U.S. Pat. No. 5,923,177 to Wardell sets forth a description of a device (hereinafter referred to as the "Wardell device") for use in testing ICs. The Wardell device consists of a plurality of probe tips arranged in a row, and attached to a housing. The stated purpose of the device is to sample a plurality of pins simultaneously. Each probe tip is an elongate, relatively narrow member that is approximately the same thickness as the horizontal distance between adjacent pins of an IC. Each probe tip tapers in both thickness and width, and terminates in a flat surface perpendicular to its length. On the side of each probe tip is a conductive surface. The conductive surfaces on either side of a probe tip are not connected electrically, and are separated by alternating layers of filler material and adhesive. In contrast, the exterior conductive surfaces of two adjacent probe tips that face each other are electrically connected. The two conductive surfaces that face each other contact and sample the signal on the solitary pin that fills the space between the two probe tips. Because the Wardell device has two relatively large conductive surfaces, it is likely that the inductance of the device will be significantly larger than that of a probe tip with a single, relatively small surface. In addition, the Wardell device is not intended to directly sample the signal on a single pin. To sample the signal on a single pin the Wardell device requires that signals on the remaining pins be disregarded. Because of its laminar structure and multiplicity of probe heads, the Wardell device would be relatively expensive and complex to produce.

BRIEF SUMMARY OF THE INVENTION

An electrical test probe wedge tip according to the present invention includes an electrically conductive interior optionally surrounded, at least partially, by an electrically insulated exterior surface. A longitudinal axis extends the length of the electrical test probe tip. In one preferred embodiment the top tip end has a single planar surface at an angle to the longitudinal axis.

A method of fabricating an electrical test probe tip includes providing an elongate electrically conductive blank coated with insulation. An angled surface is exposed by removing a portion of the first end along a plane at an angle to the longitudinal axis of the blank.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 9:
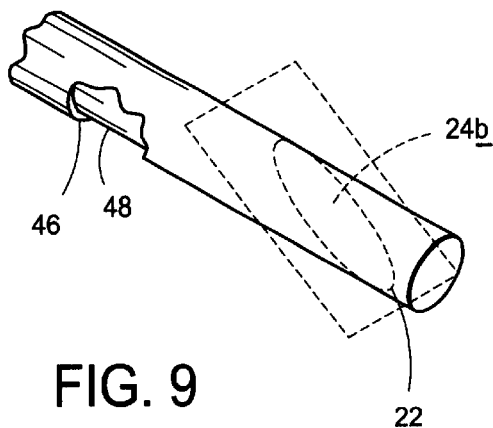
FIG. 9 is a perspective view of FIG. 8, shown coated with insulation, in partial cutaway and with a graphical representation of the modification to be made to create one preferred embodiment of the present invention.

The present invention is directed to an electrical test probe wedge tip (hereinafter the "wedge tip") indicated generally as 20. As shown in FIGS. 2–7, an exemplary embodiment of the wedge tip 20 preferably includes a top tip end 22 (or first end) with an angled surface 24, 24a, 24b capable of insertion between narrowly spaced adjacent pins of an IC, and a bottom base end 26 (or second end). Alternative embodiments may include a connector base 28, a shielding head 30, and a surface coated with insulation 46 (FIG. 9). The present invention also includes methods for making and using the wedge tip 20.

Figure 5:
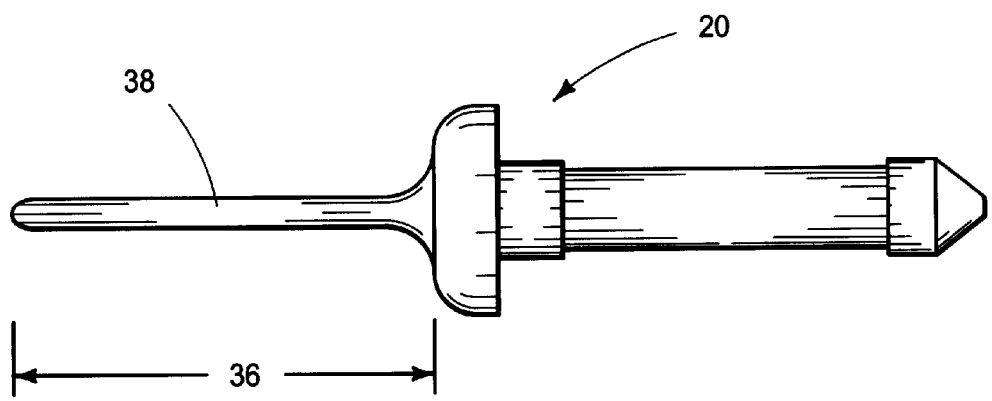
FIG. 5 is a back view of the embodiment of FIG. 2.

The wedge tip 20 has a longitudinal axis 34 (FIG. 2) extending from the top tip end 22 to the bottom base end 26. As shown in FIG. 5, the maximum length 36 of the wedge tip is measured from the top tip end to the bottom base end along back side 38. FIG. 3 shows that the minimum length 40 of the wedge tip is measured from the top tip end to the bottom base end along the front side 42. The maximum and minimum lengths 36 and 40 are not equal. The slope of angled surface 24 is defined by the difference between the maximum and minimum lengths. In one preferred embodiment, the length of the wedge tip decreases linearly from the maximum length to the minimum length forming the planar angled surface 24. The difference between the maximum and minimum lengths may be varied to adjust the angle of the angled surface to best suit an intended use. Further, alternate embodiments of the angled surface 24 may be used. For example, the angled surface could descend from the maximum length to the minimum in a curved manner, forming a concave or convex surface. The angled surface could also descend from the maximum length to the minimum in equally spaced, discrete distances, forming a stair-step surface. In addition, the angled surface could descend from the maximum length to the minimum in one step at the midpoint of the cross-section of the wedge tip. In this embodiment, the back one-half of the cross-section would be the maximum length, and the front one-half would be the minimum length. In another alternative embodiment, the angled surface could be constructed so that the edges of the angled surface are beveled. It should be noted that, in addition to a smooth, regular surface, the angled surface could include irregularities such as one or more dimples, bumps, or grooves. In addition, one or more cavities, pits, or openings could be defined on the angled surface 24.

Figure 6:
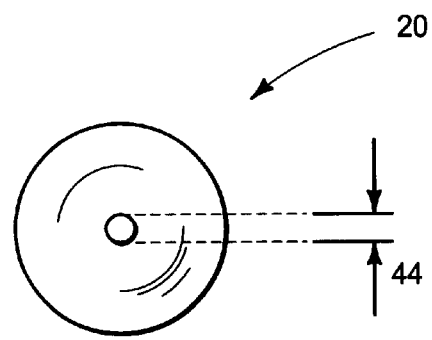
FIG. 6 is the embodiment of FIG. 2, viewed from the top looking directly into the tip.
Figure 7:
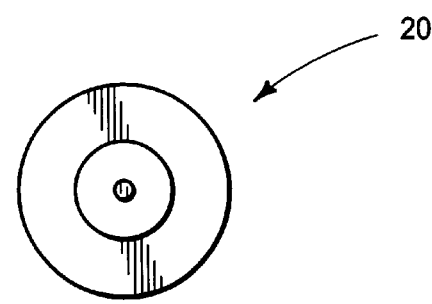
FIG. 7 is the embodiment of FIG. 2, viewed from the bottom looking directly into the base.

In one preferred embodiment, the wedge tip 20 may have a circular cross-section with a diameter 44 as shown in FIG. 6. In an alternative preferred embodiment, the cross-section may be square. In addition, the cross-section may assume a variety of geometries in various other alternative embodiments.

In one preferred embodiment of the present invention suitable for probing pins set apart by a distance of approximately 0.279 mm or less, the length of wedge tip 20 would be between 1.27 and 3.81 mm, and the angle of angled surface 24 would be between 30 and 45 degrees. The diameter 44 of the cross-section of the wedge tip should be approximately 30–60 percent greater than the distance between adjacent pins. In this exemplary embodiment, the length of the wedge tip would be 0.300 inches, the distance between the top tip end 22 and the bottom base end 26 would be 0.130 inches or 3.3 mm, and the distance between the bottom base end and the bottom 45 of the connector base 28 would be 4.3 mm. In this preferred embodiment, the angle of the angled surface 24 would be 33 degrees. The diameter of the cross-section of the wedge tip would be 0.508 mm. This example is meant to be exemplary and different dimensions could be adopted for other intended purposes.

Figure 10:
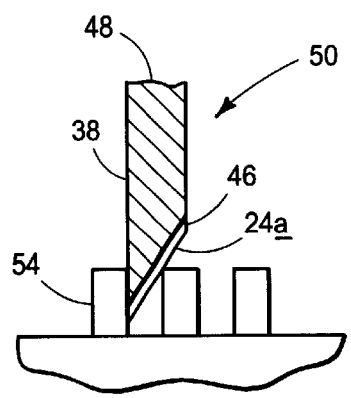
FIG. 10 is a cross-sectional view of one embodiment of an electrical test probe wedge tip inserted between the pins of an IC, this embodiment having an insulated angled surface, and an electrically conductive exterior annular surface.
Figure 11:
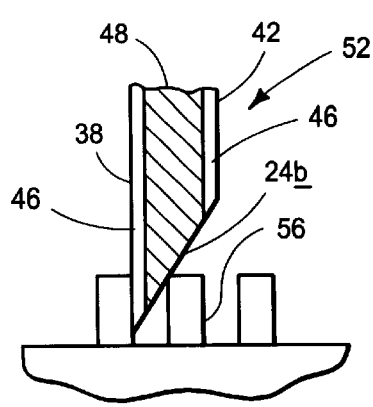
FIG. 11 is a cross-sectional view of an alternate embodiment of an electrical test probe wedge tip inserted between the pins of an IC, this embodiment having an electrically conductive angled surface, and an insulated exterior annular surface.

The wedge tip 20 is preferably made from electrically conductive material, except that the angled surface 24a, as shown in FIG. 10, may be coated with a nonconductive material 46 (herein "insulation"). FIG. 11 shows an alternative preferred embodiment of this invention in which the exterior surface of the wedge tip is at least partially coated with insulation, except that the insulation is removed from the angled surface 24b. In one preferred embodiment, the wedge tip is made from brass and the insulation is made from dip spin hard coat. It should be noted that other materials such as steel, aluminum, or any conductive metal may be used to form the conductive interior of the wedge tip. Similarly, other materials such as plastic, enamel, ceramic, or paint may be used as insulation.

Figure 1:
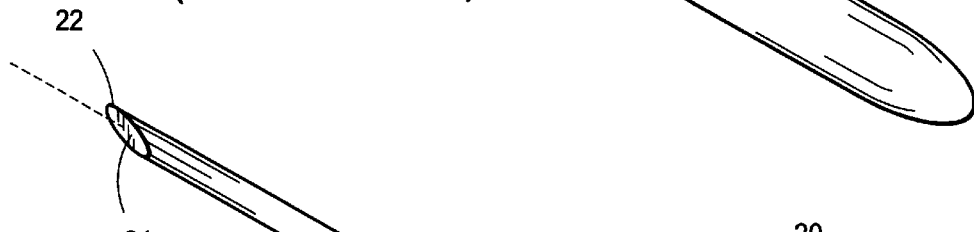
FIG. 1 is a perspective view of a prior art probe tip with a non-insulated, conical, pointed tip.
Figure 2:
FIG. 2 is a perspective view of an exemplary embodiment of the electrical test probe wedge tip of the present invention.
Figure 3:
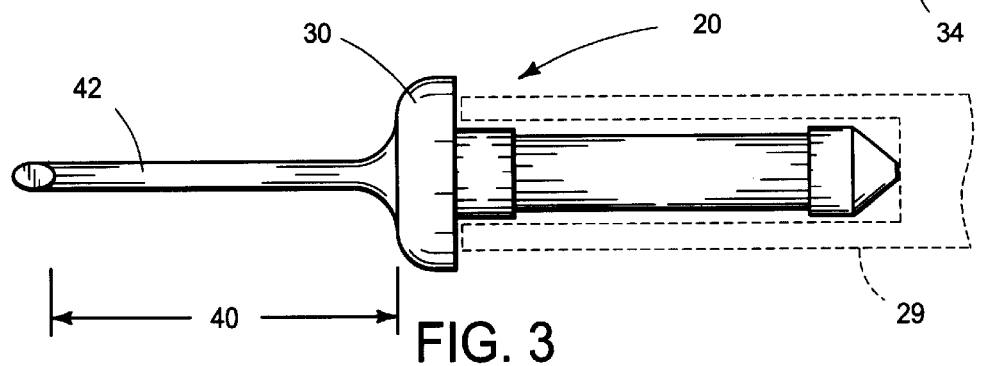
FIG. 3 is a front view of the embodiment of FIG. 2.
Figure 4:
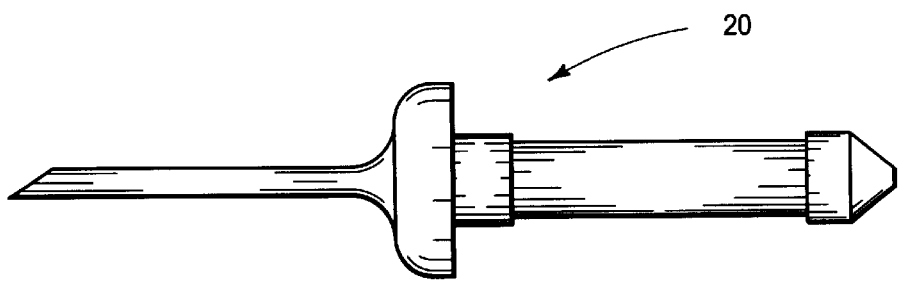
FIG. 4 is a side view of the embodiment of FIG. 2.

In the exemplary embodiment shown in FIG. 2, the bottom base end 26 of the wedge tip 20 is attached to a connector base 28, which may be coupled to a test probe 29, or otherwise directly or indirectly to a testing instrument. The shown connector base is an elongate member having a circular cross-section. In alternative preferred embodiments, the connector base may have a square cross-section or other cross sectional geometries. The connector base may be integral to the wedge tip, or it may be fastened to the bottom base end. In embodiments where the connector base is fastened to the bottom base end the connector base may be fastened by screwing it into a threaded receptacle in the bottom base end, the connector base may be fastened with glue or cement, or other methods for fastening the bottom base end to the connector base may be used. The shown connector base 28 is meant to be exemplary and may be replaced by any type of connection adapted to mate with an electrical test probe 29.

In an alternative preferred embodiment, the wedge tip 20 may be connected directly to a test probe 29 without the connector base 28. In a further alternative embodiment, the wedge tip may be an integral part of an electrical test probe 29.

As shown in FIGS. 2–5, the wedge tip 20 may flare to a shielding head 30 at the bottom base end 26. In an alternative embodiment, the shielding head 30 may be a symmetrical washer shaped disk. In an additional alternative embodiment, the bottom base end 26 of the wedge tip 20 may connect directly to the connector base 28 without a shielding head.

Figure 8:
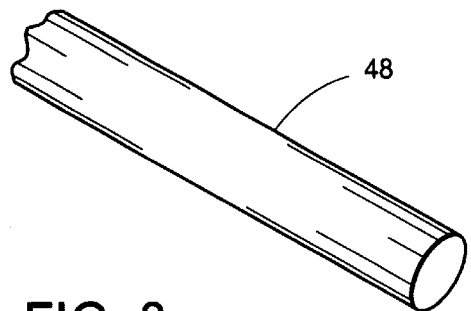
FIG. 8 is an enlarged perspective view of an elongate electrically conductive metal blank.

A general method for making the wedge tip 20 of the present invention begins with an elongate electrically conductive blank 48 (hereinafter a "blank") as shown in FIG. 8. Material may be removed from one end, according to the graphical representation shown in FIG. 9, to form the planar angled surface 24b.

Specifically, FIG. 9 shows a planar cut or other removal being made at an angle to the longitudinal axis. This creates a blank with an angled surface. A blank with an angled surface may be made by alternate methods including, but not limited to machining, casting, or forging.

Material may be removed using a variety of methods. In one preferred method, material may be removed by cutting it away. Alternatively, the material may be removed by machining, grinding, filing, or chemical etching. In addition, other methods may be used to remove the material.

The angled surface insulated wedge tip 50 shown in FIG. 10 may be made using several methods. For example, using the blank with an angled surface, the angled surface 24a can be coated with insulation 46.

The exterior surface insulated wedge tip 52 shown in FIG. 11 may be made using several methods. For example, the exterior surface of the blank with an angled surface may be coated with insulation 46. Excess insulation may then be removed from the angled surface 24b, if necessary. Alternately, the blank 48 of FIG. 8 is pre-coated with insulation 46. Material may then be removed at an angle to the longitudinal axis (as shown in FIG. 9) to form the angled surface 24b and expose the electrically conductive material of the blank 48.

Referring to the embodiment shown in FIG. 10, the signal on an IC pin (herein referred to as the "target pin") may be measured by inserting the wedge tip 50 so that the back side 38 faces the target pin 54, and the angled surface 24 faces the adjacent pin. In this manner, if the wedge tip should simultaneously contact both the target pin and the adjacent pin, a short circuit is prevented because the insulated angled surface 24 prevents electric current from flowing between the adjacent pins. Further, the lateral pressure that results when the wedge tip is inserted snugly between the adjacent and target pins results in good electrical contact with the target pin.

To measure the signal on an IC pin using the embodiment shown in FIG. 11, the wedge tip 52 is inserted so that the angled surface 24 faces the target pin 56 and the back side 38 faces the adjacent pin. The advantages of short circuit protection and good electrical contact described above are similarly present with this embodiment.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. An electrical test probe wedge tip, said wedge tip comprising:
    (a) a tip section having a longitudinal axis extending from a top tip end to a bottom base end and an exterior annular surface;
    (b) said top tip end having a single planar surface at an angle to said longitudinal axis;
    (c) said bottom base end for electrically coupling with a test probe;
    (d) insulation at least partially coating said single planar surface;
    (e) said exterior annular surface substantially adjacent said top tip end substantially free from said insulation; and
    (f) wherein said top tip end may be inserted between a target IC pin and an adjacent IC pin so that said exterior annular surface faces said target IC pin and said single planar surface faces said adjacent IC pin.

2. The wedge tip of claim 1, wherein said tip section has a cross-section that is substantially circular.

3. The wedge tip of claim 1, further comprising a connector base electrically coupled to said base end.

4. The wedge tip of claim 3, further comprising a shielding head between said bottom base end and said connector base.

5. An electrical test probe tip having a longitudinal axis extending from a first end to a second end, said tip comprising:
    (a) an electrically conductive interior for conducting electricity from said first end to said second end;
    (b) a conductive exterior-most surface at least partially surrounding said electrically conductive interior from said first end to said second end;
    (c) a maximum length measured from said first end to said second end and a minimum length measured from said first end to said second end;
    (d) an electrically insulated surface at said first end substantially descending from said maximum length to said minimum length; and
    (e) wherein said electrical test probe tip may be inserted between a target IC pin and an adjacent IC pin so that said conductive exterior-most surface faces said target IC pin and said electrically insulated surface faces said adjacent IC pin.

6. The tip of claim 5, said tip further comprising a tip section wherein said tip section has a cross-section that is substantially circular.

7. The tip of claim 5, said tip further comprising a connector base electrically coupled to said second end.

8. The tip of claim 5, wherein said conductive surface is substantially planar.

9. A method for measuring a signal on a target IC pin using an electrical test probe tip having a longitudinal axis extending from a first end to a second end, said tip comprising:
    (a) providing an electrical test probe tip having:
        (i) an electrically conductive interior for conducting electricity from said first end to said second end;
        (ii) a conductive exterior surface at least partially surrounding said electrically conductive interior from said first end to said second end;
        (iii) a maximum length measured from said first end to said second end and a minimum length measured from said first end to said second end; and
        (iv) an electrically insulated surface at said first end substantially descending from said maximum length to said minimum length; and
    (b) inserting said electrical test probe tip between said target IC pin and an adjacent IC pin so that said conductive exterior surface faces said target IC pin and said electrically insulated surface faces said adjacent IC pin.

* * * * *

UNITED STATES PATENT AND TRADEMARK OFFICE
CERTIFICATE OF CORRECTION

PATENT NO.    : 6,650,131 B2
DATED         : November 18, 2003
INVENTOR(S)   : Julie A. Campbell and Christina Colby Barsotti It is certified that error appears in the above-identified patent and that said Letters Patent is hereby corrected as shown below:

<u>Title page,</u>
Item [57], ABSTRACT, should read:

-- An electrical test probe tip of the present invention has a longitudinal axis extending from a first end to a second end and an electrically conductive interior extending substantially therebetween. A conductive exterior-most surface at least partially surrounds the electrically conductive interior. The test probe tip has a maximum length measured from the first end to the second end and a minimum length measured from the first end to the second end. An electrically insulated surface at the first end substantially descends from the maximum length to the minimum length. The electrical test probe tip may be inserted between a target IC pin and an adjacent IC pin so that the conductive exterior-most surface faces the target IC pin and the electrically insulated surface faces the adjacent IC pin. --

Signed and Sealed this

Twenty-seventh Day of April, 2004

JON W. DUDAS
*Acting Director of the United States Patent and Trademark Office*